(12) United States Patent
Krupenkin et al.

(10) Patent No.: US 7,998,559 B2
(45) Date of Patent: Aug. 16, 2011

(54) SUPER-PHOBIC SURFACE STRUCTURES

(75) Inventors: Thomas Nikita Krupenkin, Warren, NJ (US); Joseph Ashley Taylor, Springfield, NJ (US)

(73) Assignee: Alcatel Lucent, Paris (FR)

( * ) Notice: Subject to any disclaimer, the term of this patent is extended or adjusted under 35 U.S.C. 154(b) by 891 days.

(21) Appl. No.: 11/387,518

(22) Filed: Mar. 23, 2006

(65) Prior Publication Data
US 2007/0224391 A1    Sep. 27, 2007

(51) Int. Cl.
*B32B 3/00*    (2006.01)
(52) U.S. Cl. .......................... 428/210; 428/220
(58) Field of Classification Search .............. 138/39; 429/32
See application file for complete search history.

(56) References Cited

U.S. PATENT DOCUMENTS

| | | | | |
|---|---|---|---|---|
| 3,894,332 A * | 7/1975 | Nathanson et al. | ............. | 438/20 |
| 5,316,511 A * | 5/1994 | Lee | ................ | 445/24 |
| 6,126,845 A * | 10/2000 | Cathey et al. | .................. | 216/11 |
| 6,185,961 B1 | 2/2001 | Tonucci et al. | ................ | 65/60.4 |
| 2004/0191127 A1 | 9/2004 | Kornblit et al. | ............... | 422/100 |
| 2004/0209139 A1 * | 10/2004 | Extrand | .......................... | 429/32 |
| 2006/0115623 A1 | 6/2006 | Aizenberg et al. | ............ | 428/141 |

OTHER PUBLICATIONS

"Etching Process", printed from http://www.memsnet.org/mems/processes/etch.html on Dec. 7, 2005.
"Intellemetrics™", printed from http://www.intellevation.co.uk/Laser%20Monitor%20Applications.htm on Dec. 7, 2005.

* cited by examiner

*Primary Examiner* — Timothy M Speer
*Assistant Examiner* — Adam C Krupicka
(74) *Attorney, Agent, or Firm* — Jay M. Brown

(57) ABSTRACT

Superlyophobic Surface Structure, including a substrate having a surface; a plurality of nanoscale raised features on the substrate surface, each nanoscale raised feature having a length measured in a direction approximately perpendicular to the substrate surface, each nanoscale raised feature having a raised feature diameter along the length and measured in a direction approximately parallel to the substrate surface; a nanoscale top feature on each of a plurality of the nanoscale raised features, each nanoscale top feature having a top feature diameter measured in a direction approximately parallel to the substrate surface; in which an average top feature diameter is greater than an average raised feature diameter. Method of fabricating a Superlyophobic Surface Structure.

10 Claims, 7 Drawing Sheets

SUPER-PHOBIC SURFACE STRUCTURES

BACKGROUND OF THE INVENTION

1. Field of the Invention

The invention relates to structures having super-phobic surfaces.

2. Related Art

Superhydrophobic surface structures are known for their ability to repel high surface tension liquids such as water. Some superhydrophobic surface structures have been made that include a plurality of raised structures that are spaced apart by interstices and held in positions relative to each other on a substrate. Raised structures may be formed having various shapes, including posts and ridges. When a liquid having a sufficiently high surface tension makes contact with a typical superhydrophobic surface structure, the liquid may form an interface with the superhydrophobic surface structure at a local contact angle sufficiently high so that the liquid does not immediately penetrate into the interstices. Liquids having a relatively high surface tension include water, ionic liquids, and glycerol, among others. On the other hand, when a liquid having a sufficiently low surface tension makes contact with a typical superhydrophobic surface structure, the liquid may form an interface with the superhydrophobic surface structure at a local contact angle sufficiently low so that the liquid immediately penetrates into the interstices. Liquids having a relatively low surface tension include gasoline, oils, alcohols such as methanol and isopropanol, alkanes, and other hydrocarbons, among others.

Much work has been done to develop potentially useful applications for superhydrophobic surface structures in order to exploit their non-wetting behavior when contacted by liquids having high surface tension. A liquid having a sufficiently low surface tension generally may wet a superhydrophobic surface structure, while a liquid having a sufficiently high surface tension may not do so. The ability of liquids having low surface tension to wet these surfaces constitutes a vulnerability often making the surfaces impractical for use outside a highly controlled laboratory environment. This vulnerability lies in the pervasiveness of liquids having low surface tension. As examples, human fingertips generally carry natural skin oils having low surface tension, in addition to any foreign materials present that may include low surface tension liquids such as hand lotion or oily food residues. Any contact of a fingertip with a typical superhydrophobic surface structure may contaminate the surface with low surface tension liquids, disabling the non-wetting behavior of the affected region of the superhydrophobic surface structure and also allowing high surface tension liquids such as water to then freely penetrate and wet the superhydrophobic surface structure. Atmospheric aerosols are another common and pervasive source of low surface tension liquids that can easily contaminate a superhydrophobic surface structure, especially in urban environments.

There is a continuing need for new types of super-phobic surface structures that can withstand contact by a liquid having a relatively low surface tension without immediately losing their liquid repelling ability.

SUMMARY

In one example of an implementation, a superlyophobic surface structure (hereinafter "Superlyophobic Surface Structure") is provided, including: a substrate having a surface; a plurality of nanoscale raised features on the substrate surface, each nanoscale raised feature having a length measured in a direction approximately perpendicular to the substrate surface, each nanoscale raised feature having a raised feature diameter along the length and measured in a direction approximately parallel to the substrate surface; a nanoscale top feature on each of a plurality of the nanoscale raised features, each nanoscale top feature having a top feature diameter measured in a direction approximately parallel to the substrate surface; in which an average top feature diameter is greater than an average raised feature diameter.

In another example, a method of fabricating a Superlyophobic Surface Structure is provided, including: forming a multi-layer blank including a substrate layer having a substrate surface, a nanoscale raised feature-forming layer, and a nanoscale top feature-forming layer; etching the nanoscale top feature-forming layer to form nanoscale top features on the nanoscale raised feature-forming layer, each nanoscale top feature having a top feature diameter measured in a direction approximately parallel with the substrate surface; and etching the nanoscale raised feature-forming layer to form a plurality of nanoscale raised features on the substrate surface, each nanoscale raised feature having a length measured in a direction approximately perpendicular to the substrate surface and having an average raised feature diameter along the length measured in a direction approximately parallel with the substrate surface; in which an average top feature diameter is greater than an average raised feature diameter.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION

Figure 1:
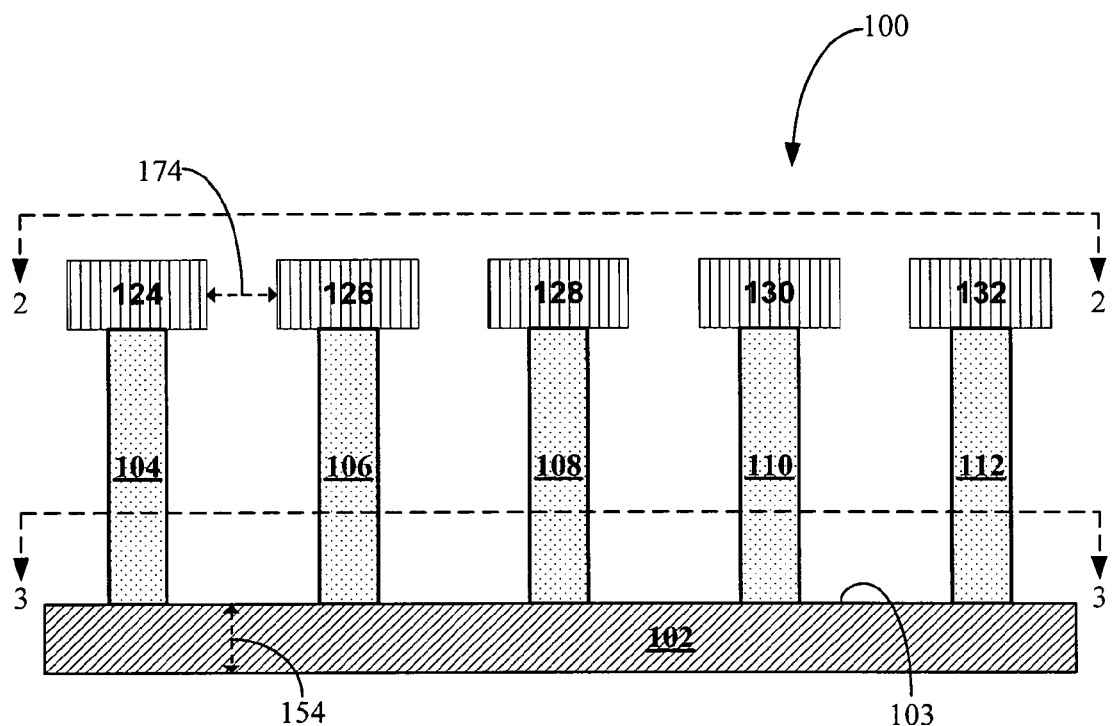
FIG. 1 is a cross-sectional side view showing an example of an implementation of a Superlyophobic Surface Structure.
Figure 2:
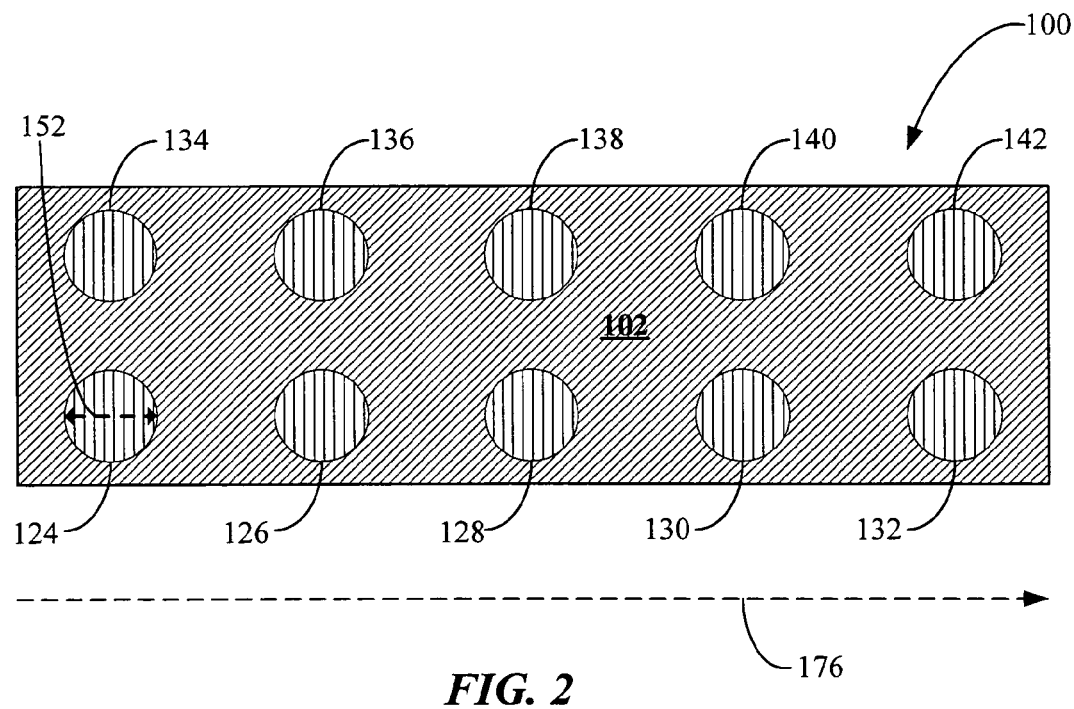
FIG. 2 is a top view taken on line 2-2 showing the Superlyophobic Surface Structure of FIG. 1.
Figure 3:
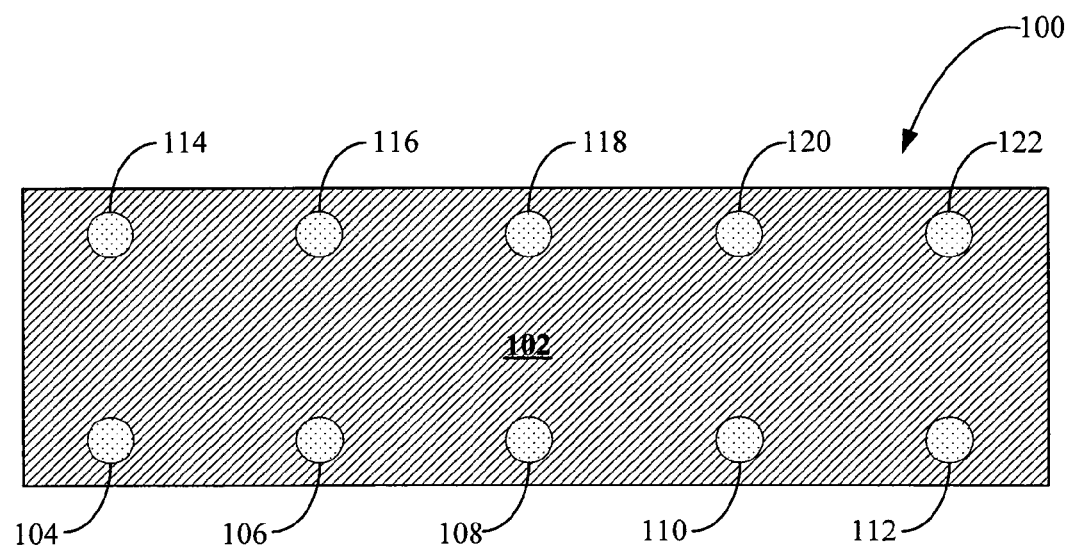
FIG. 3 is a cross-sectional top view taken on line 3-3 showing the Superlyophobic Surface Structure of FIG. 1.

FIG. 1 is a cross-sectional side view showing an example of an implementation of a Superlyophobic Surface Structure 100. FIG. 2 is a top view taken on line 2-2 showing the Superlyophobic Surface Structure 100 of FIG. 1. The term "superlyophobic" as used throughout this specification means that the subject surface structure includes a surface that may withstand contact by a liquid having a relatively low surface tension without immediately losing its liquid repelling ability. FIG. 3 is a cross-sectional top view taken on line 3-3 showing the Superlyophobic Surface Structure 100 of FIG. 1. The Superlyophobic Surface Structure 100 may include a substrate 102 having a surface 103. The Superlyophobic Surface Structure 100 may also include a plurality of posts 104, 106, 108, 110, 112, 114, 116, 118, 120 and 122 on the substrate 102 arranged in a spaced-apart array. A plurality of disks 124, 126, 128, 130, 132, 134, 136, 138, 140 and 142 may be on the posts 104, 106, 108, 110, 112, 114, 116, 118, 120 and 122, respectively.

Figure 4:
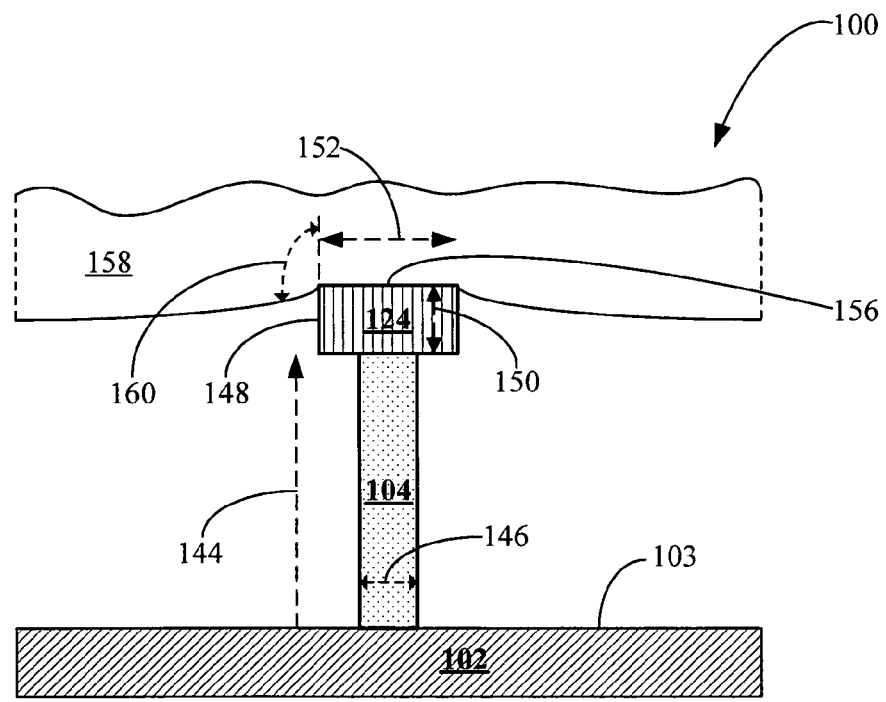
FIG. 4 is a cross sectional side view showing a portion of a droplet of a liquid in contact with a portion of the Superlyophobic Surface Structure from FIG. 1.

FIG. 4 is a cross sectional side view showing a portion of a droplet of a liquid in contact with a portion of the Superlyophobic Surface Structure from FIG. 1. In an example, the dimensions of the post 104 and the disk 124 may each be selected to be less than one millimeter and may as examples include dimensions on one or more of the orders of magnitude including angstroms, nanometers, and micrometers (collectively referred to throughout this specification, up to one millimeter, as "nanoscale"). One millimeter equals 1000 micrometers; one micrometer equals 1000 nanometers; and one nanometer equals 10 Angstroms. In another example, the post 104 may have a length above the surface 103 of the substrate 102, as indicated by the arrow 144, within a range of between about 5 micrometers and about 20 micrometers. As another example, the post 104 may have an average diameter measured in a direction approximately parallel with the surface 103 of the substrate 102, as indicated by the arrow 146, within a range of between about 100 nanometers and about 1000 nanometers, or of about 200 nanometers. In another implementation, the average diameters of the posts 104-122 may be collectively expressed with reference either to all points along their respective lengths or with reference to one or more specific points along their respective lengths. As an additional example, the vertical surface 148 of the disk 124 may have a height measured in a direction approximately perpendicular to the substrate surface 103, as indicated by the arrow 150, within a range of between about 50 Angstroms and about 1000 Angstroms, or of about 500 Angstroms. In another example, the disk 124 may have an average diameter measured in a direction approximately parallel with the substrate surface 103, as indicated by the arrow 152, within a range of between about 100 nanometers and about 1000 nanometers, or of about 400 nanometers. In an example where the disk 124 and the post 104 have respective diameters of about 1000 nanometers and about 200 nanometers, each measured in a direction approximately parallel with the surface 103 of the substrate 102, the aspect ratio of the disk diameter divided by the post diameter may be about 5:1.

It is understood that the Superlyophobic Surface Structure 100 may include a multiplicity of disks on posts spaced apart in an array on the substrate 102 in the same manner as discussed with respect to the posts 104-122 and the corresponding disks 124-142. In an example, the Superlyophobic Surface Structure 100 may include millions of such posts and corresponding disks. In another example, the substrate 102 may be a standard sized semiconductor wafer (not shown). As an example, the substrate 102 may have a thickness, as indicated by the arrow 154, of about 725 micrometers. In an additional example, the substrate 102 may be circular and have a diameter, measured in a direction approximately perpendicular to the arrow 154, of about 200 millimeters or about 8 inches.

In an example, the top surface 156 of the disk 124, and the corresponding top surfaces of the disks 126-142, may have circular shapes. In another example, the top surfaces may have another shape, such as an ellipse, a square, a rectangle, a triangle, another polygon, or another regular or irregular shape. In a further example, the top surfaces of the disks 124-142 may all have the same shape and size, or may have different sizes or different shapes or different sizes and shapes. Likewise, the cross-sectional shapes of the posts in the direction of the arrow 146 may vary. As examples, these cross-sectional shapes may be the same or different and may be circular, square, triangular, or have other regular or irregular shapes. In another implementation, continuous or discontinuous ridges or other elongated structures (not shown) having raised portions above the surface 103 of the substrate 102 in the direction of the arrow 144 may be formed instead of or together with posts. As an example, some or all of the posts 104-122 and the disks 124-142 may be integrated together into an elongated ridge.

FIG. 4 further shows a portion of a droplet 158 of a liquid in contact with the top surface 156 of the disk 124 on the post 104 on the substrate 102. The droplet 158 of liquid may have an interface with the top surface 156 at a relatively large local contact angle theta ("θ") indicated by the arrow 160. As an example, the local contact angle θ may be greater than about 90 degrees ("90°").

In FIG. 4, the droplet 158 may be a droplet of a liquid, such as water, having a diameter, measured in a direction approximately parallel with the substrate surface 103, within a range of between about several micrometers and about several millimeters at its largest point as an example. The droplet may be disposed on a plurality of disks including the disk 124. The local contact angle θ between the droplet and the disk 124 may be determined by interfacial surface tensions "γ" that generally may be expressed in units of milli-Newtons per meter (mN/m). These interfacial surface tensions may also be referred to as interfacial energy. The interfacial tension between the disk 124 and the air, gas or other liquid that surrounds the substrate will be referred to as $\gamma_{S-V}$. The interfacial tension between the droplet 158 and the air, gas or other liquid that surrounds the droplet will be referred to as $\gamma_{L-V}$. The interfacial tension between the disk 124 and the droplet 158 will be referred to as $\gamma_{S-L}$. The local contact angle θ may then be determined from equation (1):

$$\cos \theta = (\gamma_{S-V} - \gamma_{S-L})/\gamma_{L-V} \qquad \text{Equation (1)}$$

Figure 5:
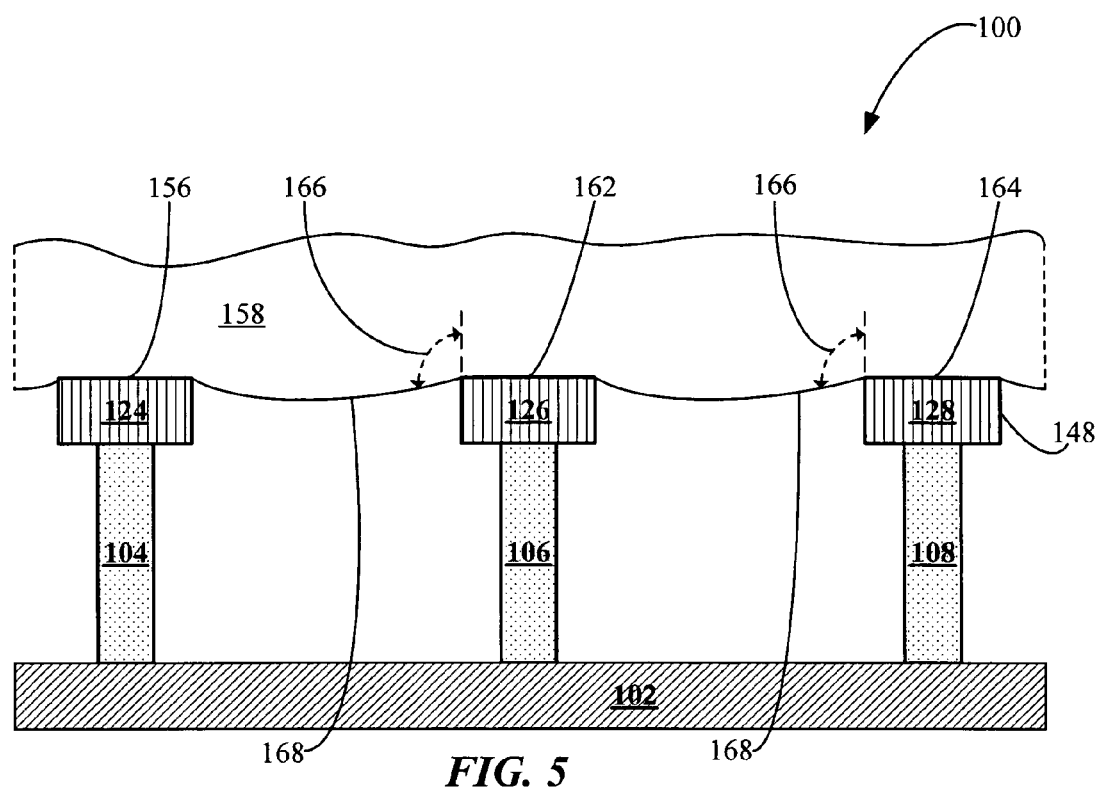
FIG. 5 is an additional cross sectional side view showing a portion of a droplet of a liquid in contact with a portion of the Superlyophobic Surface Structure from FIG. 1.
Figure 6:
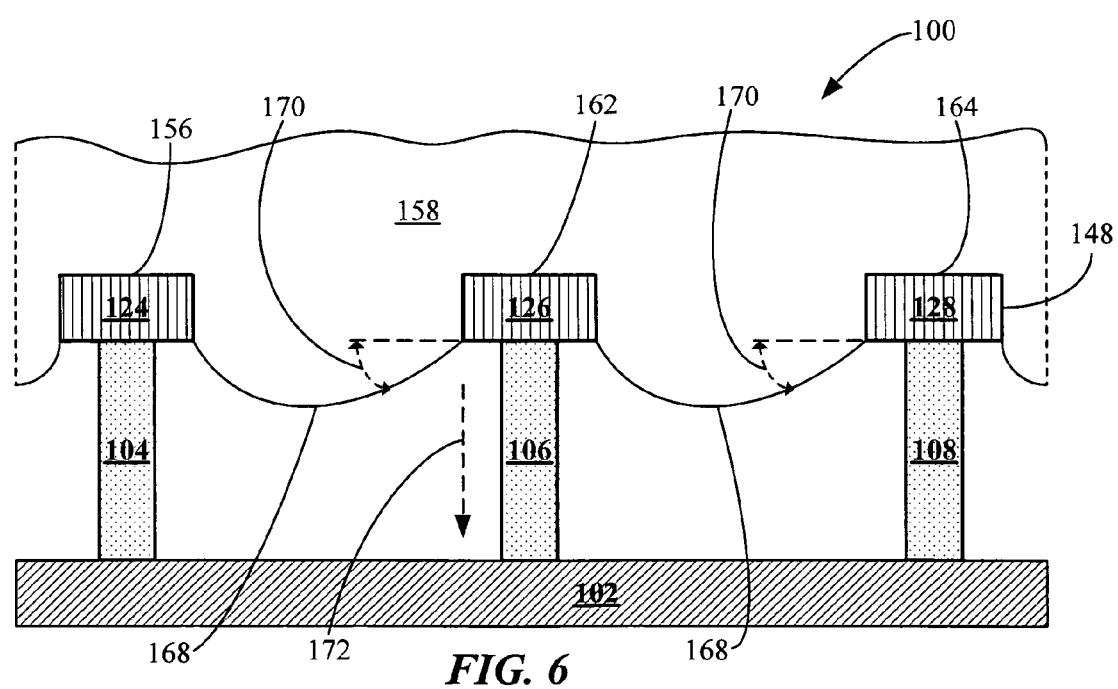
FIG. 6 is another cross sectional side view showing a portion of the droplet of a liquid from FIG. 5 in contact with a portion of the Superlyophobic Surface Structure from FIG. 1.

FIG. 5 is an additional cross sectional side view showing a portion of a droplet of a liquid in contact with a portion of the Superlyophobic Surface Structure from FIG. 1. FIG. 6 is another cross sectional side view showing a portion of the droplet of a liquid from FIG. 5 in contact with a portion of the Superlyophobic Surface Structure from FIG. 1. FIG. 5 shows a portion of the droplet 158 of a liquid in contact with the top surfaces 156, 162 and 164 of the disks 124, 126 and 128 respectively, each with a local contact angle, indicated by the arrows 166, of about 90°. In order for the liquid droplet 158 to make contact with the posts 104, 106 and 108, the vertical surfaces 148 of the disks 124, 126 and 128 may first have to be wetted. This wetting may only be achieved if the degree of curvature of the liquid-air interface 168 between the posts 104, 106 and 108 becomes high enough to allow the local contact angles indicated by the arrows 166 that the liquid droplet 158 forms with the vertical surfaces 148 of the disks 124, 126 and 128 to exceed a critical advancing position for the local contact angle 170 shown in FIG. 6. As an example, a low surface tension liquid may form local contact angles indicated by the arrows 170 of up to about 30°, which may be less than a critical advancing position for the local contact angle 170. Even in the case of such local contact angles 170, the degree of curvature of the liquid-air interface 168 may have to become significantly higher for the local contact angle 170 shown in FIG. 6 to reach a critical advancing position.

Such a degree of curvature of the liquid-air interface 168 may only be formed in response to a substantial downward external force, such as hydrostatic pressure, in the direction of the arrow 172. In the absence of such a substantial downward external force, wetting of the vertical surfaces 148 of the disks 124, 126 and 128 may not occur. As a result, the liquid droplet 158 may be prevented from penetrating inside the Superlyophobic Surface Structure 100 and making contact with the posts 104, 106 and 108. The Superlyophobic Surface Structure 100 may accordingly be capable of protecting itself against contamination even when exposed to a droplet 158 of a low surface tension liquid. This protection may facilitate self-cleaning of the Superlyophobic Surface Structure 100.

The disks 124-142 may be spaced apart by a selected distance indicated by the arrow 174 as shown in FIG. 1. As an example, the distance 174 may be within a range of between about 50 nanometers and about 100 micrometers. In another example, the disks 124-142 may be spaced apart by a plurality of different selected distances that each may be within a range of between about 50 nanometers and about 100 micrometers.

In another implementation, the disks 124-142 may be spaced apart by a plurality of different selected distances that each may be within a range of between about 100 nanometers and about 50 micrometers. In a further example, these selected distances may together define a gradient of relatively increasing or decreasing distances in a direction such as in the direction of the arrow 176 as shown in FIG. 2.

In an example, the substrate 102, the posts 104-122, and the disks 124-142 may be fabricated from selected semiconductor materials. As an example, silicon-based semiconductor materials may be utilized. Silicon-based semiconductor materials may include, as examples, elemental silicon, silicon dioxide, aluminum nitride, and silicon nitride. Materials having different compositions among the substrate 102, the posts 104-122, and the disks 124-142 may facilitate fabrication of the Superlyophobic Surface Structure 100, as will next be discussed. Silicon-based semiconductor materials may include various dopants such as further semiconductors including elements selected from one or more of Groups 2, 3, 4, 5 and 6. In an example, highly doped materials may be utilized in order to facilitate communication of an electric field through the posts 104-122 to the disks 124-142, so that superlyophobicity of the disks may be selectively and differentially controlled. Such control may accentuate or reduce superlyophobicity of the Superlyophobic Surface Structure 100, or may facilitate controlled movement of a droplet of a liquid across top surfaces of the disks 124-142 such as top surface 156 of disk 124.

Prior to utilization of the Superlyophobic Surface Structure 100, the top surface 156 of the disk 124 and the corresponding top surfaces of the disks 126-142 may be provided with a layer of a composition including a low surface energy material. As an example, a material having a surface energy of less than about 25 mN/m may be selected. The low surface energy material may be monomeric, oligomeric or polymeric. As an example, the low surface energy material may include a fluorinated hydrocarbon. In an example, a polytetrafluoroethylene polymer may be utilized.

Figure 7:
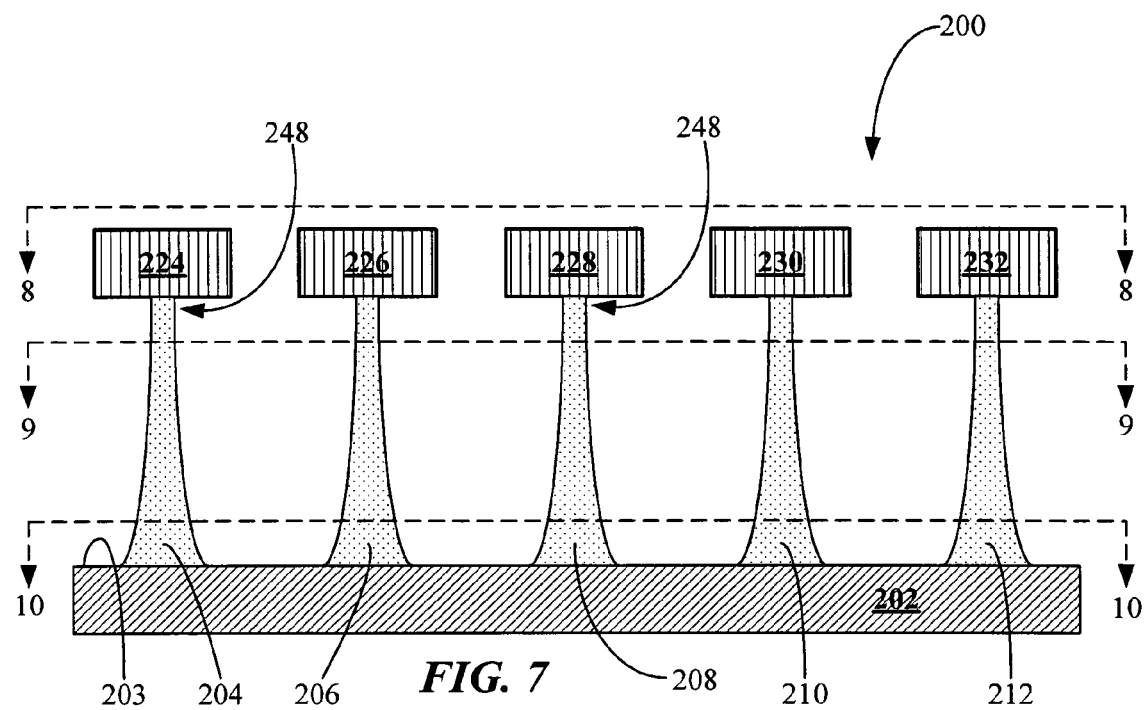
FIG. 7 is a cross-sectional side view showing an example of another implementation of a Superlyophobic Surface Structure.
Figure 8:
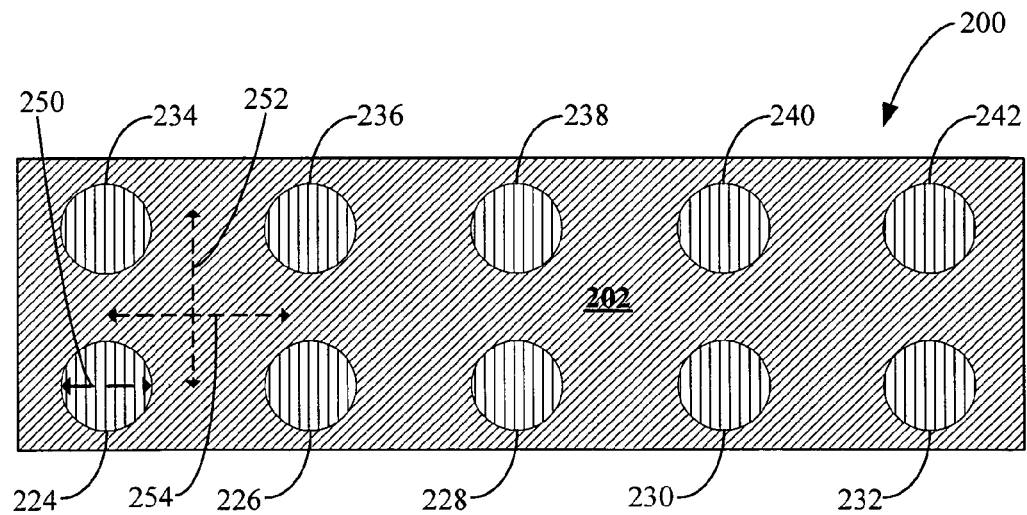
FIG. 8 is a top view taken on line 8-8 showing the Superlyophobic Surface Structure of FIG. 7.
Figure 9:
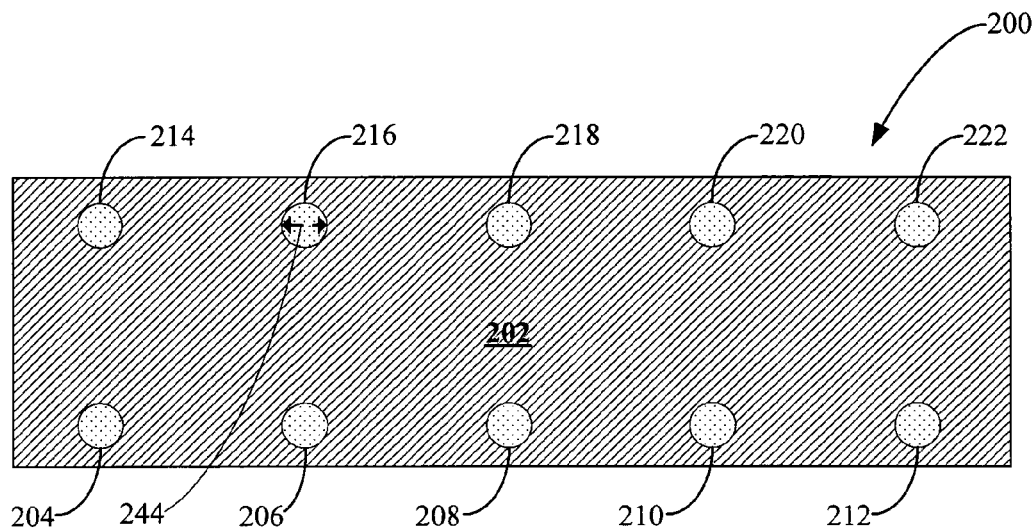
FIG. 9 is another cross-sectional view taken on line 9-9 showing the Superlyophobic Surface Structure of FIG. 7.
Figure 10:
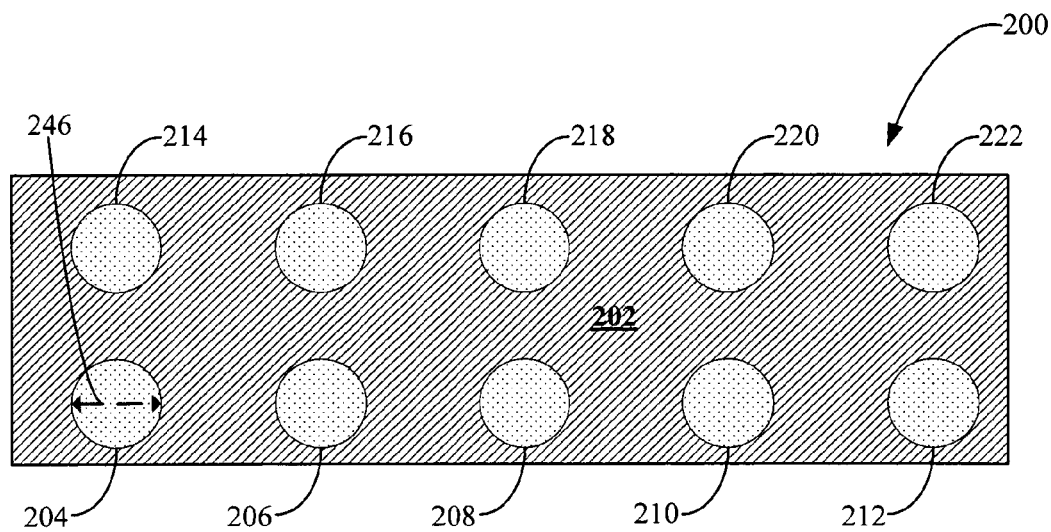
FIG. 10 is an additional cross-sectional view taken on line 10-10 showing the Superlyophobic Surface Structure of FIG. 7.

FIG. 7 is a cross-sectional side view showing an example of another implementation of a Superlyophobic Surface Structure 200. FIG. 8 is a top view taken on line 8-8 showing the Superlyophobic Surface Structure 200 of FIG. 7. FIG. 9 is another cross-sectional view taken on line 9-9 showing the Superlyophobic Surface Structure 200 of FIG. 7. FIG. 10 is an additional cross-sectional view taken on line 10-10 showing the Superlyophobic Surface Structure 200 of FIG. 7. The Superlyophobic Surface Structure 200 may include a substrate 202. The Superlyophobic Surface Structure 200 may also include a plurality of nanoscale raised features 204, 206, 208, 210, 212, 214, 216, 218, 220 and 222 on the substrate 202 arranged in a spaced-apart array. A plurality of nanoscale top features 224, 226, 228, 230, 232, 234, 236, 238, 240 and 242 may be on the nanoscale raised features 204, 206, 208, 210, 212, 214, 216, 218, 220 and 222, respectively. As an example, the nanoscale raised features 204-222 may have a first cross-sectional diameter 244 measured at line 9-9 in a direction approximately parallel with the substrate surface 203. As another example, the nanoscale raised features 204-222 may have a second cross-sectional diameter 246 measured at line 10-10 in a direction approximately parallel with the substrate surface 203. It can be seen in FIGS. 9 and 10 that the second cross-sectional diameter 246 at line 10-10 may be greater than the first cross-sectional diameter 244 at line 9-9. Referring to FIG. 7, the smaller the cross-sectional diameter 244 of the nanoscale raised features 204-222 at the points 248 where they meet the nanoscale top features 224-242, the greater the aspect ratio of the diameter 250 of the nanoscale top features divided by the cross-sectional diameter 244 of the nanoscale raised features 204-222 at the points 248, each measured in a direction approximately parallel with the substrate surface 203. However, the cross-sectional diameters 246 of the nanoscale raised features 204-222 at line 10-10 have no impact on the aspect ratio of the diameter 250 divided by the cross-sectional diameter 244. Hence, the cross-sectional diameters 246 of the nanoscale raised features 204-222 at line 10-10 may be selected to be substantially greater than the cross-sectional diameters 244 of the nanoscale raised features 204-222 at line 9-9. As an example, an aspect ratio of the cross-sectional diameter 246 of the nanoscale raised features 204-222 divided by the cross-sectional diameter 244 of the nanoscale raised features 204-222 may be within a range of between about 1:1 and about 10:1. In another implementation, an aspect ratio of the cross-sectional diameter 246 of the nanoscale raised features 204-222 measured at a first point about one micrometer away from the substrate surface 203 divided by the cross-sectional diameter 244 of the nanoscale raised features 204-222 measured at a second point about one micrometer away from the corresponding nanoscale top features 224-242 respectively, may be at least about 2:1. The relatively greater cross-sectional diameters 246 of the nanoscale raised features 204-222 at line 10-10 may contribute increased mechanical strength to the nanoscale raised features 204-222, including mechanical strength in the directions of the arrows 252 and 254. Hence, the durability of the Superlyophobic Surface Structure 200 may be accordingly increased. Furthermore, a resulting greater range of tolerable lateral movement of the nanoscale raised features 204-222 may enable the Superlyophobic Surface Structure 200 to be more flexible and stable in response to environmental perturbations such as vibrations and air currents. This increased stability may result in an additional increase in the resistance of the Superlyophobic Surface Structure 200 to wetting by a low surface tension liquid.

Referring to the discussion of FIGS. 1-6, it is understood that other nanoscale raised features may be substituted for posts, and that other nanoscale top features may be substituted for disks, and that the discussions in this specification as to posts and disks are examples of implementations of nanoscale raised features and nanoscale top features, respectively.

The stated ranges of dimensions of posts and disks likewise are applicable to other implementations of nanoscale raised features and nanoscale top features, respectively.

Figure 11:
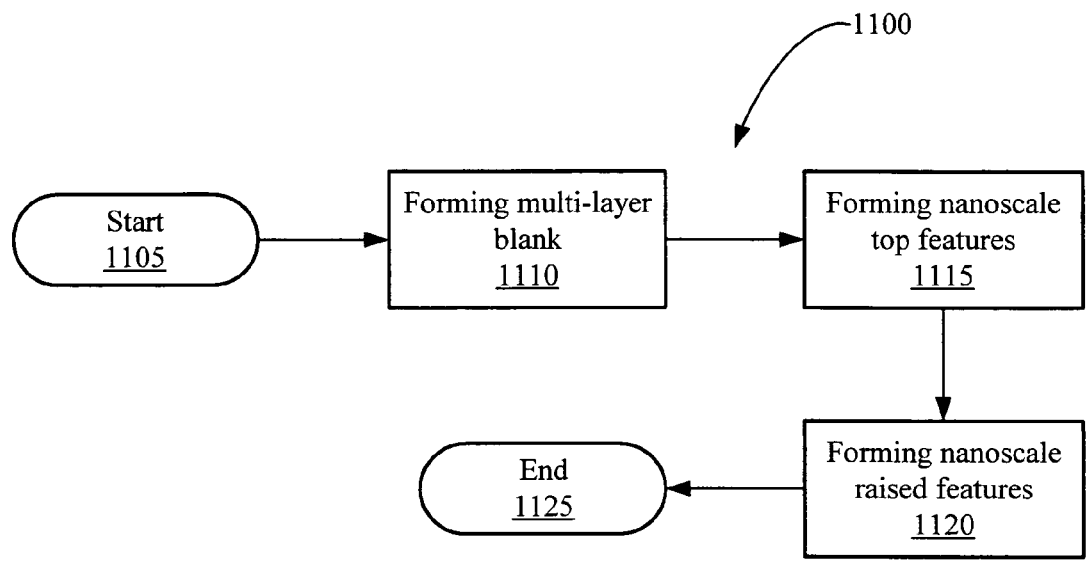
FIG. 11 is a flowchart showing an example of an implementation of a method for fabricating the Superlyophobic Surface Structure of FIG. 7.
Figure 12:
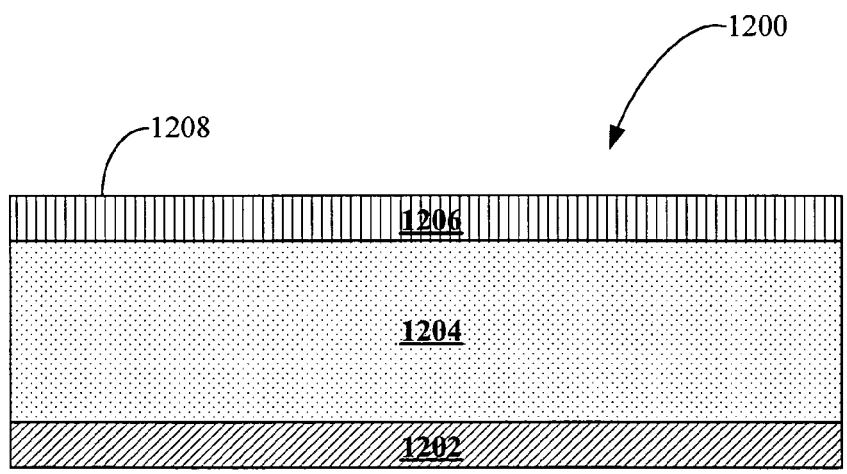
FIG. 12 is a cross-sectional side view showing a multi-layer blank for use in the method in FIG. 11.
Figure 13:
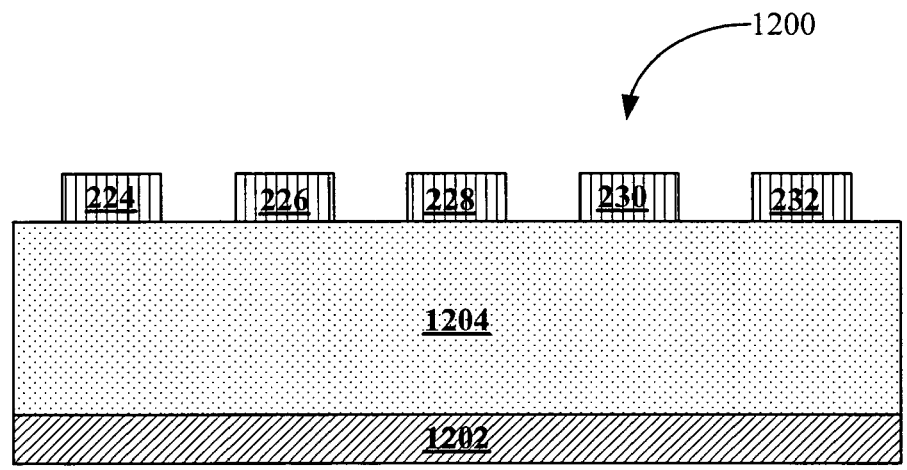
FIG. 13 is another cross-sectional side view showing the multi-layer blank of FIG. 12 after formation of nanoscale top features.
Figure 14:
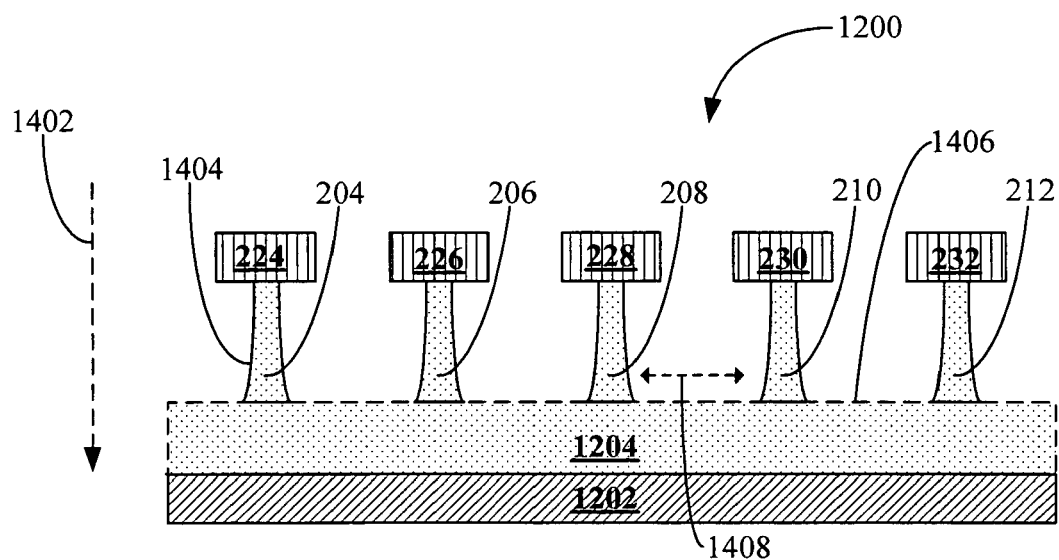
FIG. 14 is a further cross-sectional side view showing the multi-layer blank of FIG. 12 during formation of nanoscale raised features.

FIG. 11 is a flowchart showing an example of an implementation of a method 1100 for fabricating the Superlyophobic Surface Structure 200 of FIG. 7. FIG. 12 is a cross-sectional side view showing a multi-layer blank 1200 for use in the method in FIG. 11. FIG. 13 is another cross-sectional side view showing the multi-layer blank 1200 of FIG. 12 after formation of nanoscale top features 224-242. FIG. 14 is a further cross-sectional side view showing the multi-layer blank 1200 of FIG. 12 during formation of nanoscale raised features 204-222.

Referring to FIG. 11, the method 1100 starts at step 1105, and a multi-layer blank 1200 for forming the Superlyophobic Surface Structure 200 may be formed at step 1110. Referring to FIG. 12, the multi-layer blank 1200 may include a substrate layer 1202, a nanoscale raised feature-forming layer 1204, and a nanoscale top feature-forming layer 1206. The term "layer" as used throughout this specification is defined as a body of the subject material over an adjoining surface, however such body is formed. A "layer" may be the result of any deposition process undertaken in one or more than one steps. Hence, a "layer" may also include multiple layers of the same or different materials, which may or may not interpenetrate each other, and which layers together are referred to as the "layer". There is no particular limitation on the thickness of a layer except as stated. The method 1100 may as examples utilize photolithography and anisotropic dry etching to form the nanoscale top features 224-242, and deep reactive ion etching to form the nanoscale raised features 204-222. Materials may be selected for forming the substrate layer 1202, nanoscale raised feature-forming layer 1204, and nanoscale top feature-forming layer 1206 that are compatible with these processes. As an example, the nanoscale top feature-forming layer 1206 may be formed of a material that may be suitable for anisotropic dry etching to form the nanoscale top features 224-242, and that also may be resistant to a subsequent deep reactive ion etching process for forming the nanoscale raised features 204-222. In an example, the nanoscale raised feature-forming layer 1204 may include silicon, which may be more rapidly etched under the selected etching conditions than is silicon dioxide. As another example, the substrate layer 1202 may be formed of a material that may be resistant to deep reactive ion etching. As an example, the substrate layer 1202 may include silicon, the nanoscale raised feature-forming layer 1204 may also include silicon, and the nanoscale top feature-forming layer 1206 may include silicon dioxide or polycrystalline silicon. As further examples, the nanoscale top feature-forming layer 1206 may include silicon nitride or aluminum nitride.

In step 1115 of the method 1100, the nanoscale top features 224-242 may be formed. As an example, the nanoscale top features 224-242 may be formed by a photolithographic process with a photoresist, followed by anisotropic dry etching. As an example, a top surface 1208 of the nanoscale top feature-forming layer 1206 including silicon dioxide to serve as an etching hardmask may be provided with a photoresist coating. The photoresist coating may then be developed by exposure to ultraviolet light through a mask defining regions of the nanoscale top feature-forming layer 1206 that surround regions selected to form the nanoscale top features 224-242. The developed regions of the photoresist and underlying portions of the top surface 1208 may then be removed to leave behind an etching hardmask, and anisotropic dry etching of the exposed portions of the nanoscale top feature-forming layer 1206 may be carried out to form the nanoscale top features 224-242 on the nanoscale raised feature-forming layer 1204 as shown in FIG. 13.

In step 1120, the nanoscale raised features 204-222 may be formed. As an example, deep reactive ion etching ("DRIE") may be carried out to form the nanoscale raised features 204-222. DRIE may include causing a cycle to repeatedly occur that may include directional etching, alternating with polymer deposition. During the directional etching phase of DRIE, sulfur hexafluoride gas may be injected into a plasma chamber containing the multi-layer blank 1200 while a plasma may be formed using a radio frequency power source. Highly reactive fluorine ions may accordingly be generated and then accelerated between charged plates in the direction of the arrow 1402. A bias current may be simultaneously applied to the multi-layer blank 1200, which may amplify the reactivity of the fluorine ions with the nanoscale raised feature-forming layer 1204. The reactivity of the fluorine ions and the strength of the bias current may be adjusted in response to the observed silicon erosion action in order to obtain anisotropic or isotropic removal of silicon from the nanoscale raised feature-forming layer 1204 as needed at various points in the process, in order to form the nanoscale raised features 204-222. The movement of the fluorine ions in the direction of the arrow 1402 may result in chemical reaction with and physical displacement of silicon atoms from the nanoscale raised feature-forming layer 1204 of the multi-layer blank 1200, forming silicon tetrafluoride, a gas that may then be evacuated from the plasma chamber. This activity may tend to deepen interstices between the nanoscale top features 224-242 in the direction of the arrow 1402. During the polymer deposition phase, the sulfur hexafluoride gas may be substituted by carbon tetrafluoride or carbon trifluoride or a mixture. These gases may have a lower mass fraction of fluorine than does sulfur hexafluoride. As a result, the plasma formed in the polymer deposition phase may be relatively less effective in removing silicon atoms from the nanoscale raised feature-forming layer 1204. In addition, the carbon fluorides may form $C_4F_8$ and then polymerize to form polytetrafluoroethylene-like fluorinated hydrocarbon polymers on the side walls 1404 and bottom walls 1406 in partially formed interstices of the nanoscale raised feature-forming layer 1204. When the plasma gases are cycled again to sulfur hexafluoride, the fluorinated hydrocarbon polymers may temporarily resist the fluorine ion plasma, further enabling the etching to occur in the direction of the arrow 1402. However, after an initial period the fluorinated hydrocarbon polymers may be removed by the plasma from the side walls 1404 as well, and the plasma may then also erode the nanoscale raised feature-forming layer 1204 in the directions of the arrow 1408. DRIE may facilitate selective removal of portions of the nanoscale raised feature-forming layer 1204 in the directions of both the arrows 1402 and 1408. This selective removal may facilitate formation of a Superlyophobic Surface Structure 200 having a significant aspect ratio of the diameters of the nanoscale top features 224-242 indicated by the arrow 250 divided by the cross-sectional diameters 244 of the nanoscale raised features 204-222. In an example, such an aspect ratio within a range of between about 1:1 and about 5:1 may be selected in order to form a Superlyophobic Surface Structure 200 balancing superlyophobicity with mechanical strength of the nanoscale raised features. As another implementation, the aspect ratio of the diameters of the nanoscale top features 224-242 divided by the diameters 244 of the nanoscale raised features 204-222 may be greater than 1:1. In a further example, the aspect ratio of the diameters of the nanoscale top features 224-242 divided by the diameters 244 of the nanoscale raised features 204-222 may be greater than about 1.1:1. As an additional implementation, the aspect ratio of the diameters of the nanoscale top features 224-242 divided by the diameters 244 of the nanoscale raised features 204-222 may be greater than about 2:1. The DRIE cycle may be controlled by changing the gas composition to allow less etching in the directions of the arrow 1408 as the nanoscale raised feature-forming layer 1204 is etched in the direction of the arrow 1402. In this manner, the nanoscale raised features 204-222 may be tapered as shown in FIG. 7 earlier discussed, with a cross-sectional diameter 246 as shown in FIG. 10 that is greater than a cross-sectional diameter 244. Silicon dioxide, as an example, may be resistant to both phases of DRIE when carried out using sulfur hexafluoride, carbon tetrafluoride and carbon trifluoride, so that a Superlyophobic Surface Structure 200 having nanoscale raised features with nanoscale top features 224-242 shaped as "nail heads" may be fabricated. The method 1100 then ends at step 1125.

As an example, DRIE may be utilized to carry out etching of a silicon dioxide nanoscale top feature-forming layer in step 1115. As another example, carbon tetrafluoride or carbon trifluoride or both may be utilized. A high bias may be applied to reduce the resistance of silicon dioxide to the DRIE process.

In a further example, a multi-layer blank for forming the Superlyophobic Surface Structure 200 may include a nanoscale raised feature-forming layer 1204 including a polymer, and a nanoscale top feature-forming layer 1206 including silicon dioxide. The nanoscale top features 224-242 may be formed as discussed above in connection with FIGS. 11-13. An oxygen plasma may then be utilized to isotropically etch the nanoscale raised feature-forming layer 1204 to form the nanoscale raised features 204-222 as discussed above in connection with FIGS. 11, 12 and 14.

In another implementation, the nanoscale raised feature-forming layer 1204 may include aluminum or a hydrocarbon polymer, and the DRIE process may be carried out using a gas including chlorine or oxygen, respectively. In this implementation, the nanoscale raised feature-forming layer 1204 may be first anisotropically etched and then isotropically etched, in order to generate a significant aspect ratio of the diameter 250 of the nanoscale top features 224-242 divided by the diameter 244 of the nanoscale raised features 204-222. The formation of the nanoscale raised features 204-222 may then be completed by anisotropic etching.

The Superlyophobic Surface Structures 100 and 200 may be utilized in end-use applications where a surface is needed that may repel a liquid having a high surface tension and that may be resistant to contamination by a liquid having a low surface tension. As an example, the Superlyophobic Surface Structures 100 and 200 may be utilized as self-cleaning surfaces. As an implementation of a self-cleaning surface, both high surface tension liquids and low surface tension liquids may be repelled by the Superlyophobic Surface Structures 100 and 200. A small droplet of a liquid on the Superlyophobic Surface Structure 100 or 200 may be able to absorb and then remove any solid particulate contamination from these Superlyophobic Surface Structures 100 and 200, thus providing a self-cleaning effect.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A structure, comprising:
a substrate having a substrate surface;
a plurality of spaced-apart nanoscale top features collectively forming a superlyophobic surface over the substrate, each nanoscale top feature having a diameter measured in a direction approximately parallel with the substrate surface; and
a plurality of nanoscale raised features on the substrate surface, each of the nanoscale raised features supporting one of the nanoscale top features over the substrate, each of the nanoscale raised features having a length measured in a direction approximately perpendicular to the substrate surface, and each of the nanoscale raised features having a diameter along the length and measured in a direction approximately parallel with the substrate surface;
wherein at a first point along the length of each of the nanoscale raised features and being located near the substrate surface, the diameter of the nanoscale raised feature is greater than at a second point, the second point being spaced apart from the first point along the length of the nanoscale raised feature and being located near the supported nanoscale top feature; and
wherein an average diameter of the nanoscale top features is greater than an average diameter of the nanoscale raised features at the second point.

2. The structure of claim 1, wherein the length of each nanoscale raised feature is within a range of between about 5 micrometers and about 20 micrometers.

3. The structure of claim 1, wherein the average diameter of the nanoscale raised features is within a range of between about 100 nanometers and about 1000 nanometers.

4. The structure of claim 1, wherein each nanoscale top feature has a height measured in a direction approximately perpendicular to the substrate surface, and an average height of the nanoscale top features is within a range of between about 50 Angstroms and about 1000 Angstroms.

5. The structure of claim 1, wherein the average diameter of the nanoscale top features is within a range of between about 100 nanometers and about 1000 nanometers.

6. The structure of claim 1, wherein an aspect ratio is defined as the diameter of a nanoscale raised feature at the first point wherein the first point is located about one micrometer away from the substrate surface, divided by the diameter of the nanoscale raised feature at the second point wherein the second point is located about one micrometer away from the nanoscale top feature, and the aspect ratio is at least about 2:1.

7. The structure of claim 1, wherein each of the nanoscale raised features includes a post on the substrate.

8. The structure of claim 1, wherein each of the nanoscale top features includes a disk.

9. The structure of claim 1, wherein each of the nanoscale raised features is tapered between the first and second points.

10. The structure of claim 1, wherein an average diameter of the nanoscale top features is greater than an average diameter of the nanoscale raised features.

* * * * *